(12) United States Patent
Adkins, Jr. et al.

(10) Patent No.: US 11,709,208 B2
(45) Date of Patent: Jul. 25, 2023

(54) TEST POINT DEVICE

(71) Applicant: Grace Technologies, Inc., Davenport, IA (US)

(72) Inventors: Charles Ronald Adkins, Jr., Newell, WV (US); Roger Steven Clarke, Newell, WV (US); Gang Chen, Newell, WV (US)

(73) Assignee: GRACE TECHNOLOGIES, INC., Davenport, IA (US)

( * ) Notice: Subject to any disclaimer, the term of this patent is extended or adjusted under 35 U.S.C. 154(b) by 0 days.

(21) Appl. No.: 17/448,590

(22) Filed: Sep. 23, 2021

(65) Prior Publication Data

US 2022/0091192 A1 Mar. 24, 2022

Related U.S. Application Data

(60) Provisional application No. 63/198,010, filed on Sep. 24, 2020.

(51) Int. Cl.
*G01R 31/52* (2020.01)
*G08B 5/36* (2006.01)
*G01R 1/067* (2006.01)

(52) U.S. Cl.
CPC ............ *G01R 31/52* (2020.01); *G01R 1/067* (2013.01); *G08B 5/36* (2013.01)

(58) Field of Classification Search
CPC .... G01R 31/52; G01R 1/067; G01R 1/06788; G01R 19/00; G01R 19/0007;
(Continued)

(56) References Cited

U.S. PATENT DOCUMENTS 4,151,363 A * 4/1979 Nichols .................. H02G 3/065
174/669
5,485,356 A * 1/1996 Nguyen ............... H01R 13/717
362/95
(Continued)

FOREIGN PATENT DOCUMENTS

CN 206990773 U * 2/2018

OTHER PUBLICATIONS

Connecting Portable Generator to Home Wiring, https://web.archive.org/web/20190121072358/http://www.generatorsforhomeuse.us/connect-generator-to-home/(Year: 2012).*
(Continued)

*Primary Examiner* — Patrick Assouad
*Assistant Examiner* — Demetrius R Pretlow
(74) *Attorney, Agent, or Firm* — Goodhue, Coleman & Owens, P.C.

(57) ABSTRACT

In order to provide an environmentally secured voltage testing interface, an electrical enclosure box comprising a front panel is herein-described, into which is mounted a voltage indicator comprising a plurality of LED indicators that indicate a status of one or more circuits coupled thereto and monitored thereby. A test point device is also mounted through the front panel and comprises an interface comprising a plurality of external measurement sockets configured to receive one or more probes for manual measurement of voltages, wherein each external measurement socket is coupled to a voltage divider that is further coupled to each of a plurality of respective wires coupled to respective LED indicators of the voltage indicator.

20 Claims, 7 Drawing Sheets

(58) Field of Classification Search
CPC .............. G01R 19/0023; G01R 19/003; G01R 19/0069; G01R 19/0084; G01R 19/145; G01R 19/155
See application file for complete search history.

(56) References Cited

U.S. PATENT DOCUMENTS

| | | | | |
|---|---|---|---|---|
| 6,133,531 | A * | 10/2000 | Hayduke | H02G 3/081 174/67 |
| 6,649,838 | B1 * | 11/2003 | Lopez, Sr. | H02G 3/14 174/67 |
| 7,036,948 | B1 * | 5/2006 | Wyatt | H01R 13/6683 362/276 |
| 7,715,176 | B2 * | 5/2010 | Perez | G01R 22/065 361/660 |
| 7,824,196 | B1 * | 11/2010 | Oddsen | H01R 25/006 439/106 |
| 8,013,613 | B2 * | 9/2011 | Allen, Jr. | G01R 19/155 324/522 |
| 9,496,696 | B2 * | 11/2016 | Bulancea | H02G 3/14 |
| 2005/0195090 | A1 * | 9/2005 | Finan | H04B 3/54 340/538 |
| 2006/0096775 | A1 * | 5/2006 | Noest | H02G 3/14 174/67 |
| 2006/0132143 | A1 * | 6/2006 | Sears | G01R 31/69 324/508 |
| 2009/0115662 | A1 * | 5/2009 | Edwards | G01S 1/16 342/413 |
| 2009/0284385 | A1 * | 11/2009 | Tang | H02G 3/18 340/638 |
| 2013/0214922 | A1 * | 8/2013 | Clarke | G01R 19/155 324/501 |
| 2013/0320776 | A1 * | 12/2013 | Cook | H02J 13/00036 307/131 |
| 2014/0265577 | A1 * | 9/2014 | Beckman | H02J 3/14 307/39 |
| 2017/0269128 | A1 * | 9/2017 | Bugaris | G01R 19/155 |
| 2018/0358767 | A1 * | 12/2018 | Brower | H01R 12/7082 |
| 2020/0062125 | A1 * | 2/2020 | Brauner | H02J 7/34 |
| 2020/0191345 | A1 * | 6/2020 | Chien | F21V 21/22 |

OTHER PUBLICATIONS

Reliance Controls, Extra-Duty In-Use Weatherproof Covers for residential and commercial applications, http://www.reliancecontrols.com/Catalogs/in-use-covers/Weatherproof%20In-Use%20Covers.pdf (Year: 2017).*

British weatherproof socket with clever design, bigclivefotcom, https://www.youtube.com/watch?v=IqOzWunmKdE, 3 pages (Year: 2019).*

Kieron King, Safer "Lock Out Tag Out" with Permanent Electrical Safety Devices, https://www.linkedin.com/pulse/safer-lock-out-tag-permanent-electrical-safety-kieron-king-esis-(Year: 2016).*

* cited by examiner ably. The electrical potential being present on the
TEST POINT DEVICE This application claims the priority benefit of U.S. Provisional Patent Application No. 63/198,010 filed Sep. 24, 2020 and titled "TEST POINT DEVICE," which is incorporated by reference in its entirety.

BACKGROUND

The following relates to the electrical power arts. It particularly relates to monitoring a safe electrical disconnection of a high voltage circuit for servicing, and will be described with particular reference thereto. However, the following will also find application in routine monitoring of electrical line voltages and in other aspects of electrical safety.

To verify electrical isolation, electrical safety monitors which monitor electrical energy potentials of monitored electrical lines of an electrical panel are utilized. The electrical safety monitors provide a warning with light emitting diode ("LED") indicators in response to an electrical potential being present on the monitored lines. During servicing, electricians verify normal operation of the indicators while the panel is powered and then verify all of the indicators are extinguished while the panel is powered down before opening the panel. Although electrical safety monitors have proven to be reliable, final verification by lack of illumination provides less assurance than desired due to the possibility of circuit failure or malfunction which could likewise be the culprit for extinguished indicators and not just the absence of voltage on the monitored lines.

Additionally, although the operating current required for indication is extremely low, typically less than 1 milliampere at 750 VAC 3-phase, the electrical safety monitors are often rated for 750 VAC continuous operation or more, and the monitored line voltages entering the monitor are at full 3-phase line voltage potentials. To further electrically isolate the electrical safety monitors due to the high energy potential during operation, the housing of these monitors are typically non-conductive and the electronics are fully encapsulated in a high quality thermoset potting compound. It is desired to have the electrical safety monitor include a separate internally mounted electrical package and display adaptor mounted in the panel to provide an indication when an electrical potential is present on the monitored lines.

The following description contemplates an improved approach that overcomes the aforementioned limitations and others.

SUMMARY

The subject innovation relates to a test point device that incorporates a power alert device while utilizing a novel configuration of internal resistors that provides a safer "no shock" level measurement via a measurement interface outside the electrical enclosure. The device uses multiple series resistors that connect to a voltage source to be measured, and also connect to a voltage measurement terminal that connects to a smaller value resistor that is coupled to a common connection point inside the device. With each measurement point being connecting this way, the hazardous voltage accessible on an electrical enclosure box is limited to a safe level (e.g., 0.001-100 V or the like). The voltage to be measured at a measurement interface is reduced by a sufficient factor of (e.g., 10, 100, 1000) at the measurement terminals. The device employs enough resistance to limit the current inside the electrical box to a safe non-shocking level at the measurement terminal on the outside of the electrical enclosure box. The device also comprises a dedicated mounting location for a power alert device to reduce space needed need on the outside of the enclosure.

According to one aspect, a system that facilitates providing an environmentally secured voltage testing interface comprises an electrical enclosure box comprising a front panel into which is mounted a voltage indicator comprising a plurality of LED indicators that indicate a status of one or more circuits coupled thereto and monitored thereby, and a test point device that is mounted through the front panel and comprises an interface comprising a plurality of external measurement sockets configured to receive one or more probes for manual measurement of voltages, wherein each external measurement socket is coupled to a voltage divider that is further coupled to each of a plurality of respective wires coupled to respective LED indicators of the voltage indicator.

According to another aspect, a test point device comprises an interface having a plurality of external measurement sockets configured to receive one or more probes for manual measurement of voltages, wherein each external measurement socket is coupled to a voltage divider that is further coupled to each of a plurality of respective wires coupled to respective LED indicators of a voltage indicator, and a front protection cover that protects the external measurement sockets from the environment.

DETAILED DESCRIPTION

The problem to be solved relates to how to safely monitor and measure voltage outside of electrical enclosures while maintaining a voltage level that is below a shock hazard level. In one embodiment, a single resistor connected in series allows for a safer voltage measurement by limiting the current to a lower level.

The described test point device incorporates a power alert device while utilizing a novel configuration of internal resistors that provides a safer "no shock" level measurement via a measurement interface outside the electrical enclosure that is covered by an integrated latching cover. The device can be configured to use wither a single resistor per measured line, or multiple series resistors per measured line, that connect to a voltage source to be measured. The single or multiple series resistors are provided on each of a plurality of lines to be measured, each line being connected to the voltage source.

In one embodiment, a single resistor is employed per line, and the voltage reduction is in the range of 0% to 2.5%. Each line is further connected to a voltage measurement terminal into which a probe or the like can be inserted to measure the voltage of a given line. In another example, the voltage reduction is in the range of 0.8% to 1.25%. In yet another example, the voltage range is in the range of 1% to 1.05%. As will be appreciated by those of skill in the art, different voltage ranges can be employed to achieve a desired result.

In another embodiment, multiple series resistors are employed on each measured line, which also connects to a voltage measurement terminal that is further connected to a smaller value resistor that is coupled to a common connection point inside the device. This arrangement allows for a reduced voltage measurement. With each measurement point being connecting this way, the hazardous voltage accessible on an electrical enclosure box is limited to a safe level (e.g., 1-100 Volts) and is safely covered unless or until a measurement is needed. The voltage to be measured at the measurement interface is reduced by a sufficient factor of (e.g., 10, 100, 1000, etc.) at the measurement terminals. E.g., in a case where 1000V is applied within the electrical box, the voltage can be stepped down to, e.g., 1V at the measurement terminals on the measurement interface outside of the measurement box. The device employs enough resistance to limit the current inside the electrical box to a safe non-hazardous level for a human (e.g., below 100V or less) at the measurement terminal on the outside of the electrical enclosure box. The device also comprises a dedicated mounting location for a power alert device to reduce space needed on the outside of the enclosure.

Figure 1:
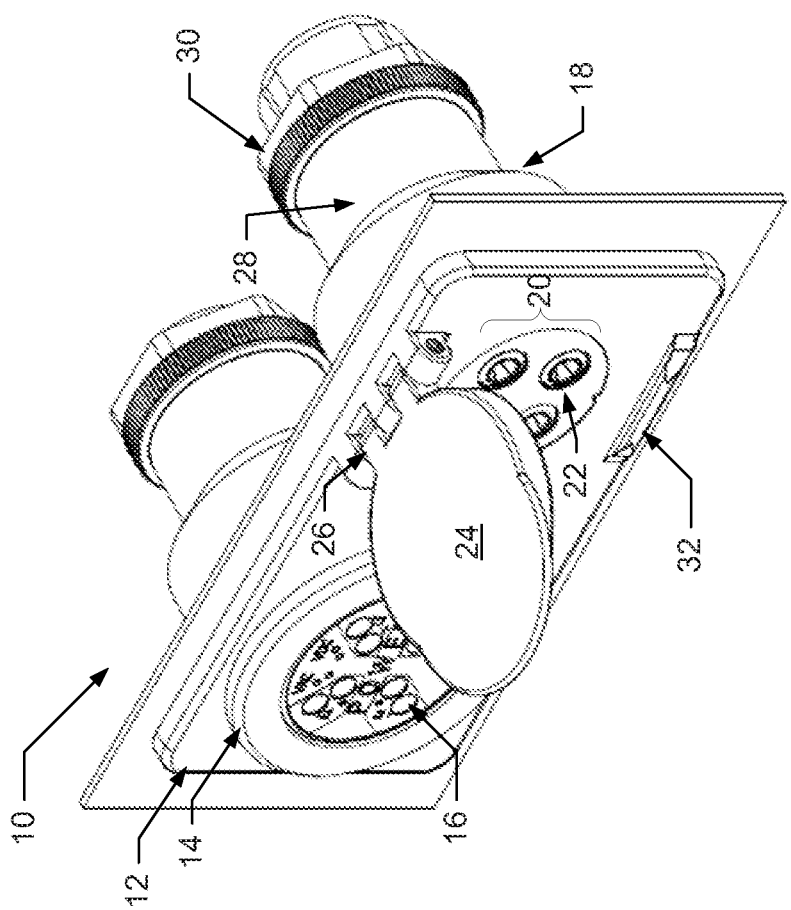
FIG. 1 illustrates a system that facilitates providing an environmentally secured voltage testing interface, in accordance with one or more aspects described herein.

FIG. 1 illustrates a system 10 that facilitates providing an environmentally secured voltage testing interface, in accordance with one or more aspects described herein. The system comprises a front plate or panel 12 of an electrical enclosure box into which is mounted a voltage indicator 14 (e.g., such as a UPA series voltage indicator manufactured by Marsh Bellofram and described in U.S. Pat. Nos. 6,703, 938 and 9,013,296, which are hereby incorporated by reference in their entireties herein) comprising a plurality of LED indicators 16 (shown as circles on the voltage indicator 14) that indicate a status of one or more circuits coupled thereto and monitored thereby. The system further includes a test point device 18, which is mounted to the front panel 12 and comprises an interface 20 comprising a plurality of external measurement sockets 22 configured to receive one or more probes for manual measurement of voltages. In one embodiment, the measurement sockets protrude from the surface of the interface. In another embodiment, the measurement sockets are recessed or flush-mounted into the interface to provide a flat interface surface against which the cover seals. The test point device further comprises a front protection cover 24 that keeps the test point connection measurement sockets 22 protected from the environment when testing is not being performed. In one embodiment, the front protection cover is attached to the front plate 12 with a hinge 26 or other means that allows the front protection cover to be securely closed or securely open when needed. In one embodiment, the protection cover 24 is clear or translucent to permit a technician to see the measurement sockets 22 through the protection cover.

The back of the test point device 18 comprises resistors and wiring (not shown in FIG. 1) that extend from the back to connect wires for the voltages to be monitored. These is also provided an O-ring seal (not shown in FIG. 1; see FIG. 3) that is located on the back side of the front panel and securely seals the test point device against the back side of the front panel. The test point device is secured by installing a spacing sleeve 28 that presses against the enclosure when tightening a nut 30 or other securing means on the back of the test point device.

Also shown is a latch receiver 32 that receives a latch protrusion (not visible in FIG. 1; see reference numeral 34 in FIGS. 2, 3, 5, 7, and 8)

Figure 2:
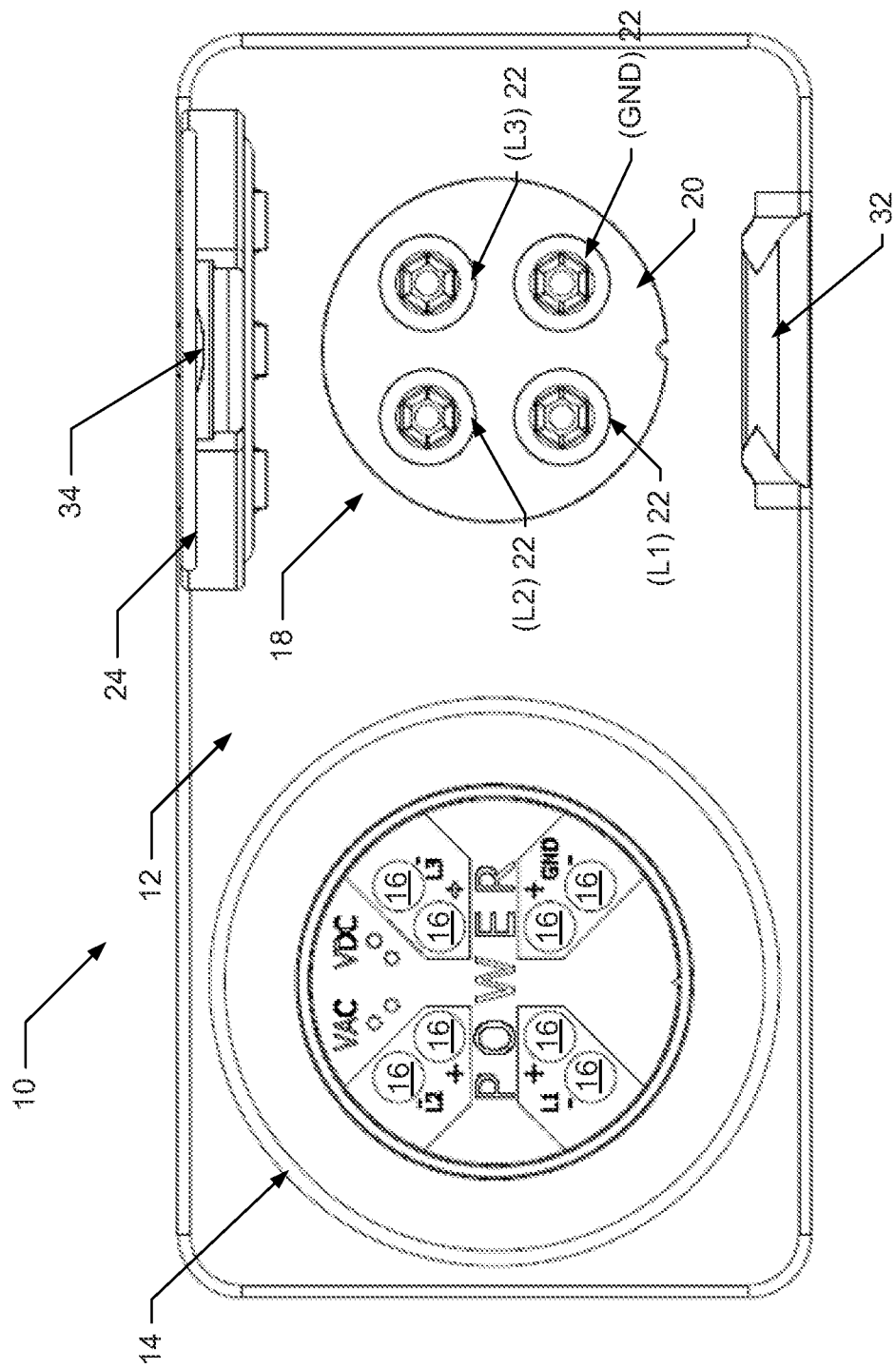
FIG. 2 illustrates a front view of the system, in accordance with one or more features described herein.

FIG. 2 illustrates a front view of the system 10, in accordance with one or more features described herein. The illustration shows the front plate or panel 12 into which is mounted a voltage indicator 14 comprising a plurality of LED indicators 16 that indicate a status of one or more circuits coupled thereto and monitored thereby. The system further includes a test point device 18, which is mounted through the front panel 12 and comprises an interface 20 comprising a plurality of external measurement sockets 22 configured for manual measurement of voltages. The test point device further comprises a front protection cover 24 that keeps the test point connection measurement sockets 22 protected from the environment when testing is not being performed. Also shown are a latch protrusion 34 that, when the cover 24 is in a closed position, mates with a latch receiver 32 to secure and lock the cover against the front panel. This aspect serves to provide a weatherproofing feature that facilitates keeping the interface 22 dry when the interface is not in use.

Figure 3:
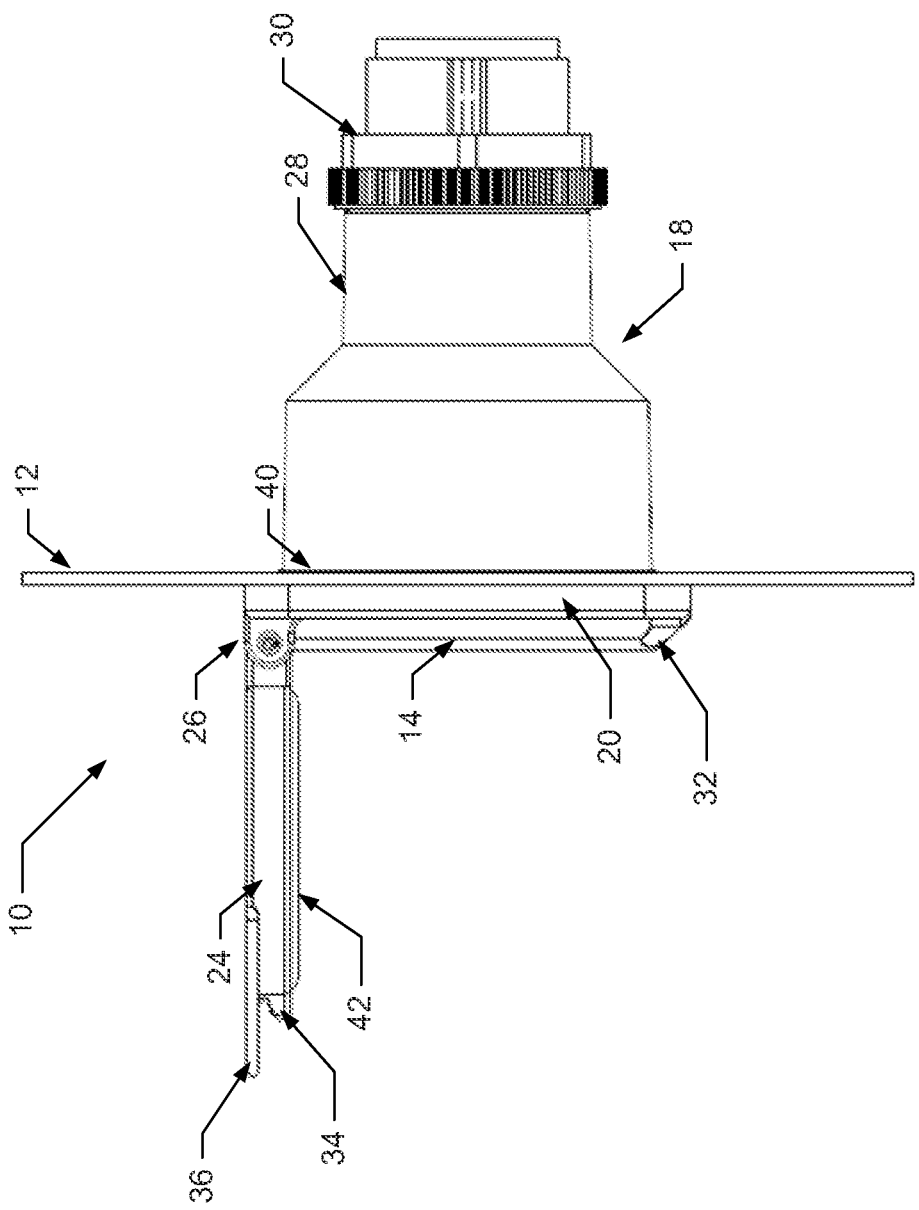
FIG. 3 illustrates a side view of the system showing the test point device, in accordance with one or more features described herein.

FIG. 3 illustrates a side view of the system 10 showing the test point device 18, in accordance with one or more features described herein. The illustration shows the front plate or panel 12 to which the test point device 18 is mounted to the front panel 12. Also shown in side view is the voltage indicator 14 on the far side of the test point device 18. The test point device further comprises a front protection cover 24 that keeps the test point connection measurement sockets 22 (not shown in FIG. 3 for being recessed into the interface 20 mounted through the front panel 12; see FIGS. 1 and 2) protected from the environment when testing is not being performed. In one embodiment, the front protection cover is attached to the front plate 12 with the hinge 26 or other means that allows the front protection cover to be securely closed or securely open when needed.

The back of the test point device 18 comprises resistors and wiring (not shown in FIG. 3) that extend to connect wires for the voltages to be monitored. There is also provided an O-ring seal 40 that is located on the back side of the front panel and securely seals the test point device against the back side of the front panel. The test point device is secured by installing a spacing sleeve 28 that presses against the inner front and back walls or panels of the enclosure when a nut 30 or other securing means is tightened against a back wall (not shown) of the test point device.

The interface 20 further comprises a latch receiver 32 that mates with a latch protrusion 34 on the protection cover when in the closed position. In one embodiment, the latch mechanism 32, 34 is a snap type latch wherein the protrusion 34 snaps into the receiver 32. Also provided is a latch release tab 36 that is configured to permit manual detachment of the latch mechanism by a technician when voltage measurement is to be performed. The tab 36 may comprise a rubber or plastic material that can be manipulated or pulled by the technician in order to release the cover 24.

The cover 24 also comprises an O-ring 42 that provides a weatherproof seal when the cover 24 is latched against the interface 20 and/or front panel 12.

Figure 4:
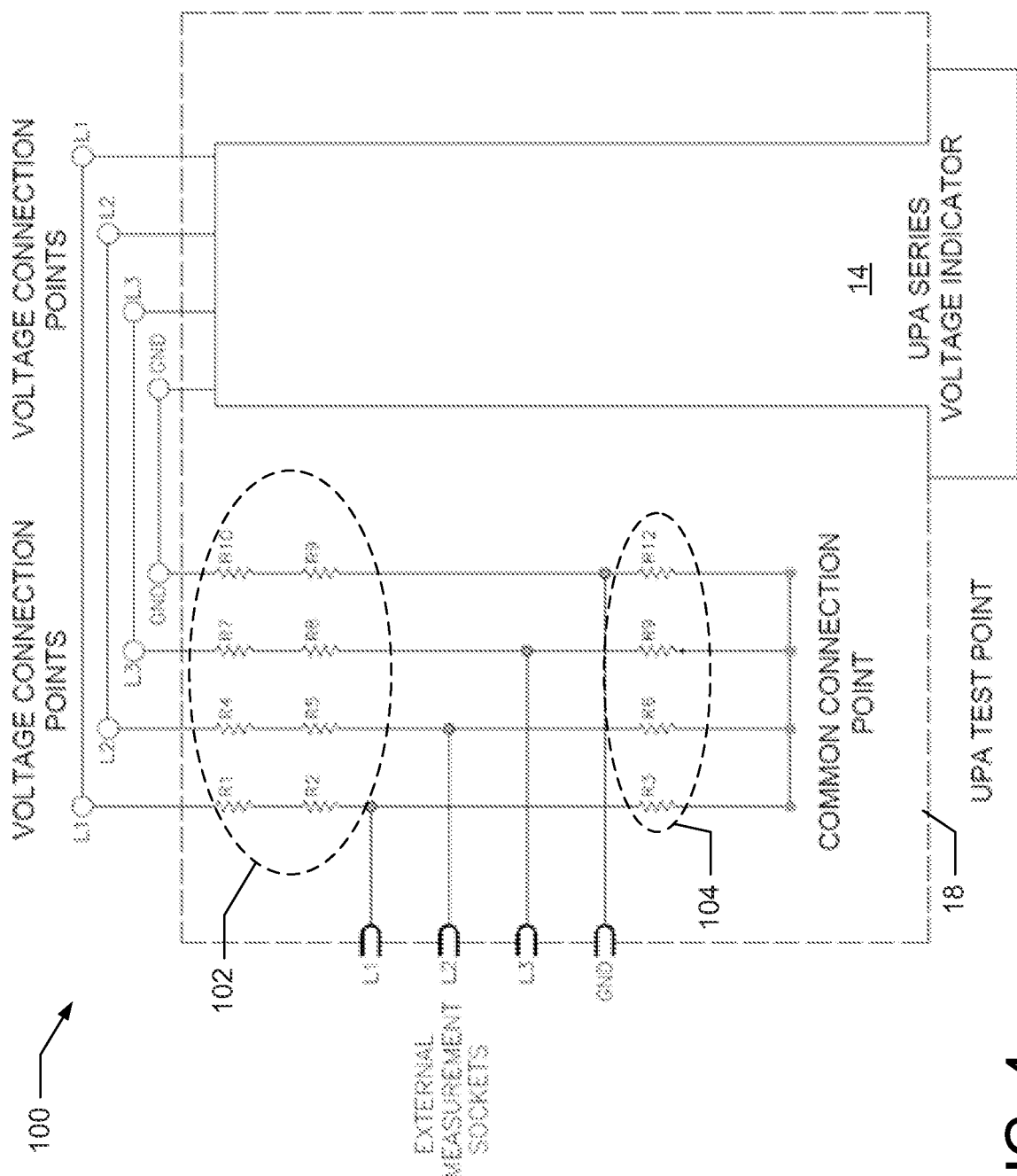
FIG. 4 shows a schematic of the safety circuitry within the test point device, in accordance with one or more features herein.

FIG. 4 shows a schematic of the safety circuitry 100 within the test point device 18, in accordance with one or more features herein. An example system voltage of, e.g., 1000 V can be considered, where a voltage reduction is desired to permit a technician to safely measure system voltage without being exposed to 1000V. Wires from the back of the test point device 18 connect to the same net wire connections points as the voltage indicator device (reference numeral 14, FIGS. 1 and 2) device. The wires connect to a printed circuit board (PCB) (not shown) that connects the resistors and external measurement sockets 22 (FIGS. 1-3) for lines L1, L2, L3, and Ground (GND).

In one embodiment, the boards connect via an interlocking design or with connectors in an x pattern. The board arrangement can also be configured to allow for different arrangements and configurations of the measurement sockets on the front of the device. In one embodiment, there are two printed circuit boards (PCBs) connected via an "X" pattern that allows for the square interface 20 of the external measurement sockets 22. In this configuration one PCB is configured to have an open slot wide enough to accept the second PCB with a corresponding slot. The first PCB slot can be arranged just off center of the board, open at the top, and extends partially through the length of the board. The second PCB has a corresponding slot that is open at the bottom, off center and extends partially up length of the first PCB. The slots arranged in this manner allow the two boards to interlock and connect together without the use of any additional connectors or wires, and further conserve space within the device while still permitting heat dissipation.

The wires are configured to connect to the board closer to a narrow end or bottom of the test point device 18 (see FIGS. 1, 2, 3, 5, 7, 8, and 9) with the larger value resistors 102 connecting in series along the length of board up to the measurement sockets. The smaller value resistors 104 connect to the terminal sockets near to top board and will connect to each other at the common connection point.

According to the illustrated example, power is received through the resistors 102 (which in one example are 1M ohm resistors, although other resistance values are contemplated as will be appreciated by those of skill in the art) dividing down the voltage and reducing the current. The external measurement sockets 22 (FIGS. 1-3) for lines L1, L2, L3, and GND connect between the respective resistors 102 and respective resistors 104, (which in one example may be 2K resistors or some other suitable resistor having a lower resistance that the resistors 102) as shown. This connection point on each measured line creates a voltage divider circuit that allows for a safe, non-hazardous voltage and current level to be measured on the external measurement sockets, which mitigates a shock hazard for the technician measuring the voltage on the monitored circuit. in the foregoing example, with 1000V applied across L1 and L2 voltage connection points, the measured voltage at the L1 and L2 external measurement sockets can be reduce to 1 V. In this example, even if the connection points were to be shorted, there would only be 0.25 mA of current accessible at the measurement sockets.

The wire connections L1, L2, L3, and GND connect to the lines to be monitored externally on the device. On the inside of the device 18, L1, L2, L3 and GND connect each connect via the PCB to R1, R4, R7 and R10 respectively.

Two different modes of operation are provided: mode 1 is operational when no external connections to the measurement terminals are made; and mode 2 is operational when a measurement device is connected to read the voltage, in which case the current path may change.

Under mode 1 of operation, when voltage is present between any two external voltage connection points of L1, L2, L3, and GND, there is a path for current to flow. For power present between L1 and L2. In one example, the power flows through resistors R1 and R2 to drop 49.95% of the total voltage, then to R3 and R6 to drop 0.1% of the voltage, and then out through R5 and R4 to drop remaining 49.95% of the voltage. It will be appreciated however that other configurations of resistors, current or power flow paths, etc., may be employed to effect a desired voltage drop.

Under mode 2 of operation, when voltage is present between any two external voltage connection points of L1, L2, L3, and GND, there is an alternate path for current flowing through the external measurement sockets. In one example, assuming a meter connection impedance of 10M ohms present between L1 and L2, the power flows through resistors R1 and R2 to drop, e.g., 49.95% of the total voltage. Power then flows to R3 and R6 in parallel with the meter resistance to drop 0.1% of the voltage and then out through R5 and R4 to drop remaining 49.95% of the voltage.

Figure 5:
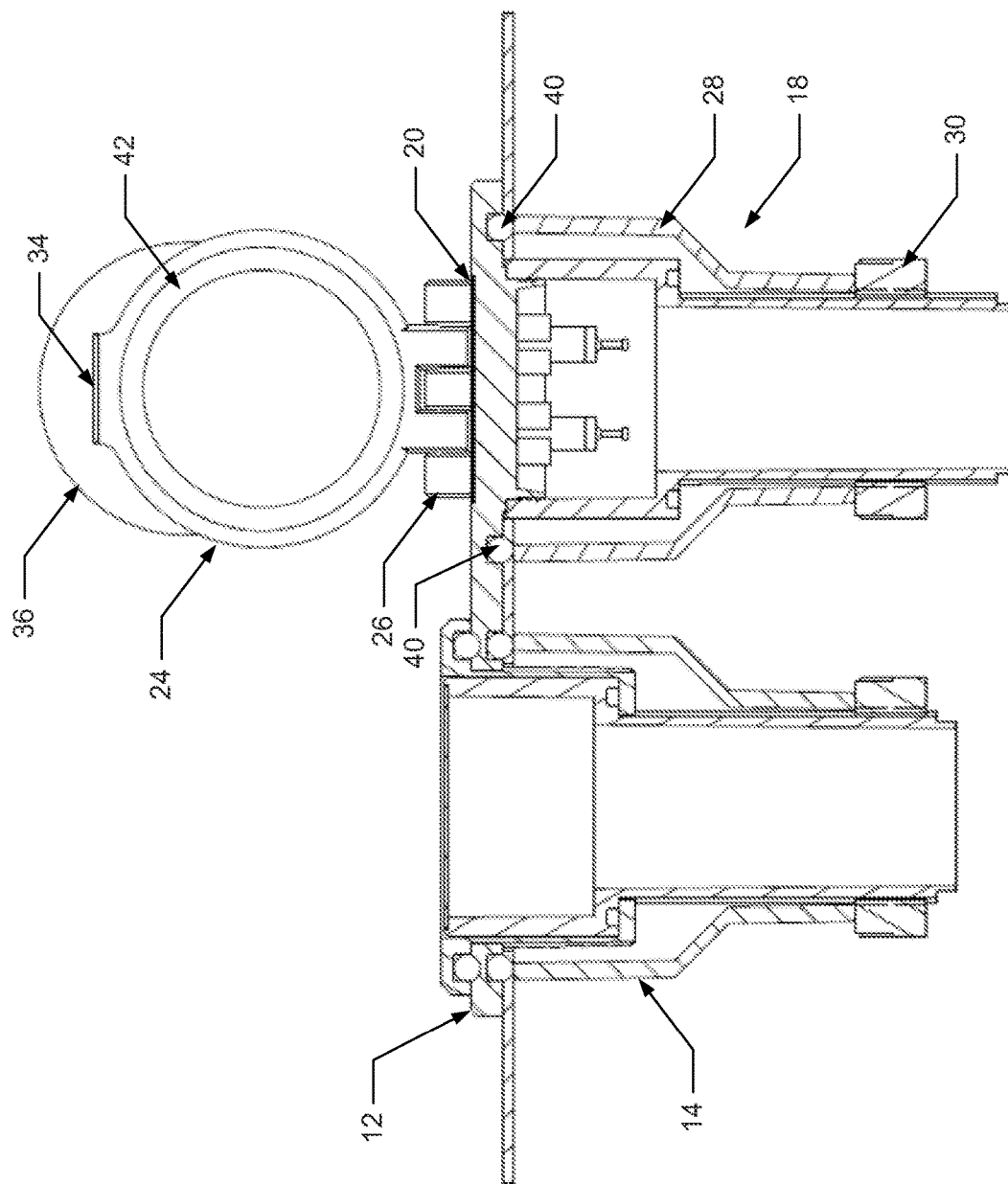
FIG. 5 illustrates a bottom view of the test point device, in accordance with one or more features described herein.

FIG. 5 illustrates a bottom view of the voltage indicator 14 and the test point device 18, in accordance with one or more features described herein. The test point device is biased against the front plate 12 by the nut or other fastening means 30 that is tightened against the spacing sleeve 28. Also shown is the protection cover 24, and the O-ring 40 in cross-section. The interface 20 is shown below the hinge 26 that connects the protection cover to the front plate 12. The latch protrusion 34 and latch release tab 36 are also shown, as well as the protection cover O-ring 42.

Figure 6:
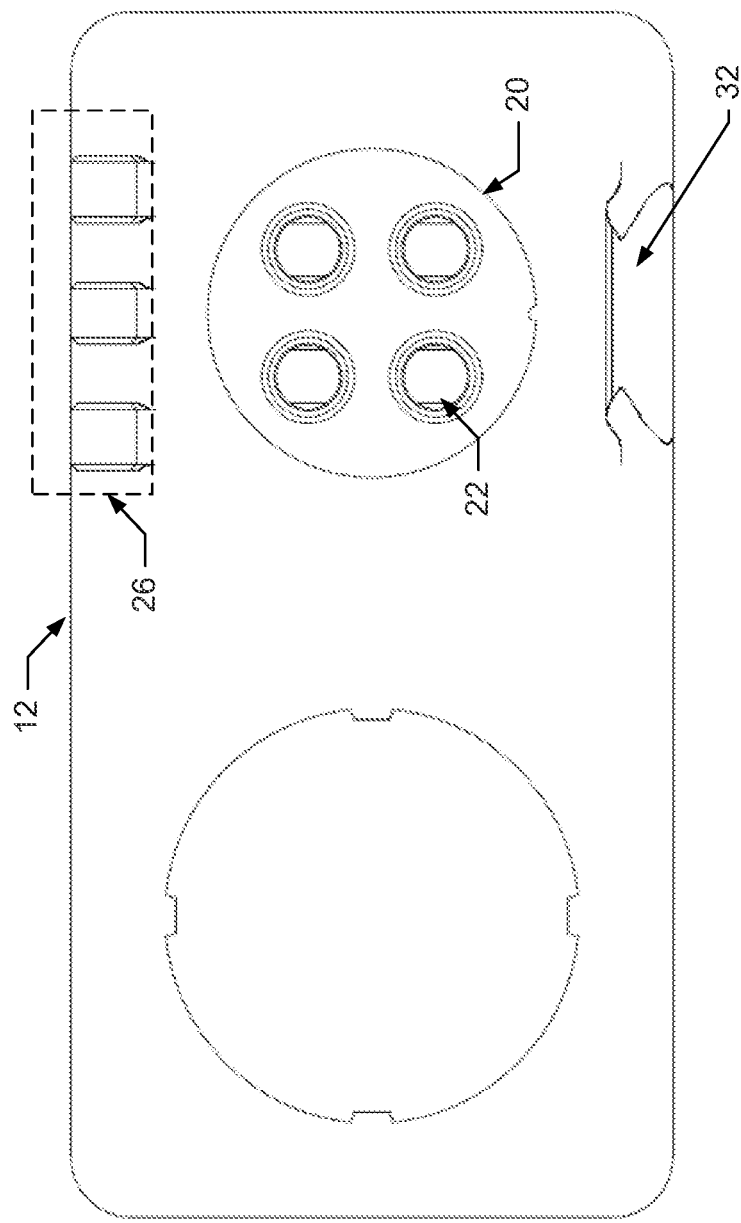
FIG. 6 illustrates a front view of the system, in accordance with one or more features described herein.

FIG. 6 illustrates a front view of the system, in accordance with one or more features described herein. In the non-limiting example of FIG. 6, examples of dimensions a provided. For instance, vertical and horizontal spacings between the measurements sockets 22 of the interface 20 are shown as been, e.g., one half inch apart. Also shown are the hinge 26 and the latch receiver 32.

It will be appreciated that any desired spacings (e.g., 0.5 inches, 0.67 inches, 1.0 inches, 1.5 inches, 1 cm, 1.5 cm, etc.) and/or arrangement of the measurement sockets may be employed, and furthermore that the measurement sockets need not be equidistant from each other or arranged in a symmetrical pattern such as the illustrated square pattern. For instance, the measurement sockets may be arranged in a vertical, angled, or horizontal line, in a staggered arrangement, etc., as will be appreciated by one of skill in the art.

The illustrated example also shows the front panel 12 as having a horizontal:vertical aspect ratio of approximately 2:1, without being limited thereto. For instance, the front panel may be, e.g., 5 inches wide by 2.5 inches high, or the like. Other dimensions are possible as will be understood by those of skill in the art.

Figure 7:
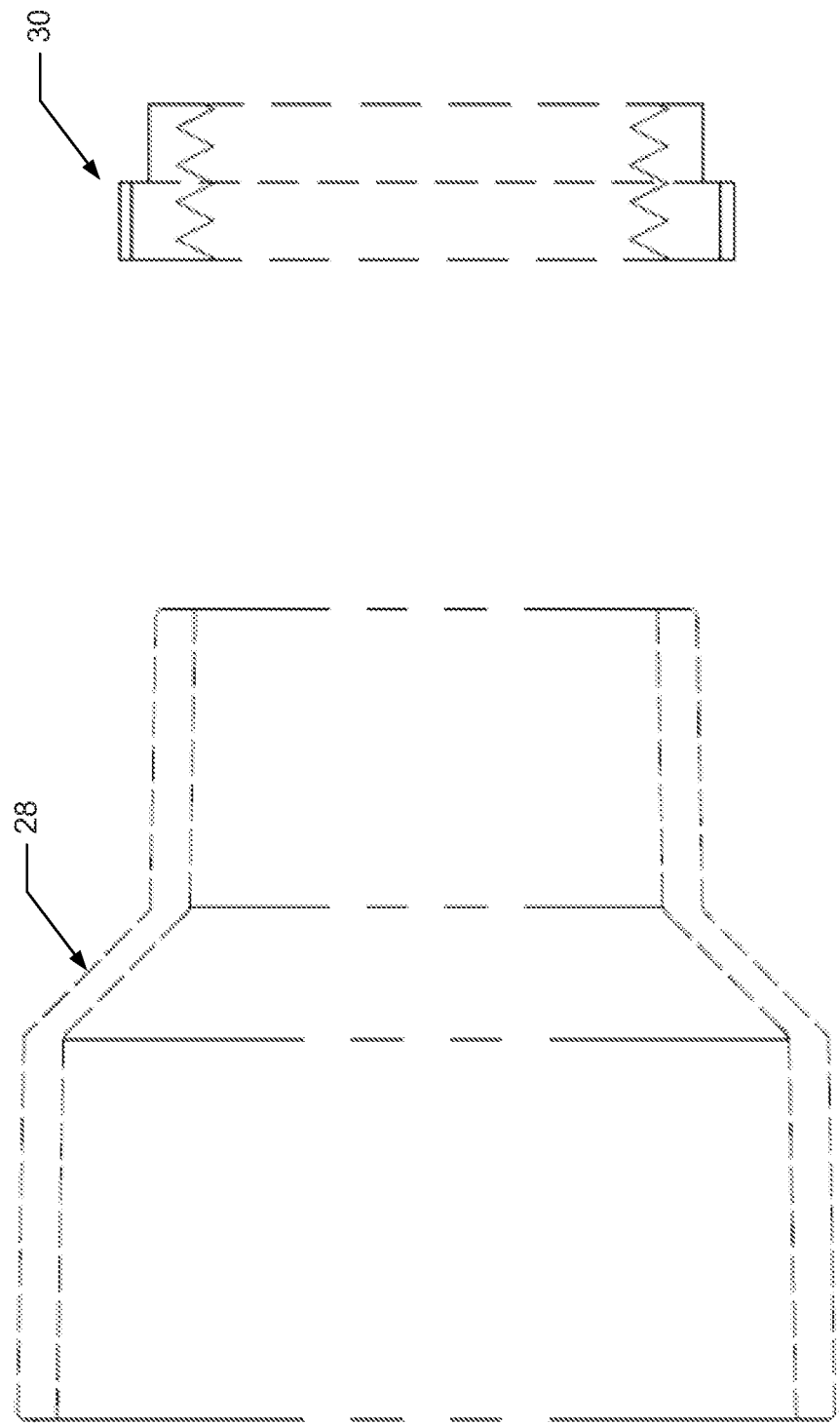
FIG. 7 illustrates side view of the spacing sleeve and the nut or other fastening means, in accordance with various features described herein.

FIG. 7 illustrates side view of the spacing sleeve 28 and the nut or other fastening means (e.g., wing nut, threaded cap, etc.) 30, in accordance with various features described herein. In the illustrated example, the spacing sleeve has a width of, e.g., approximately 2 inches and a height of approximately 2 inches at a front end (i.e., the end that mates with the inner surface of the front panel 12 (not shown in FIG. 9). The spacing sleeve tapers down to a height of approximately 1.4 inches to mate with the nut or other fastening means 30. It will be understood by those of skill in the relevant arts that the specific dimensions described herein are provided by way of example only, and that the herein-described systems and methods are not limited to the particular dimensions described with regard to the examples provided herein.

In this manner, the herein described system facilitates providing a safe non-hazardous voltage level to be provided for measurement by a technician despite a high unsafe circuit voltage across the measured circuit.

The claimed innovation has been described with reference to the various embodiments. Modifications and alterations will occur to others upon reading and understanding the preceding detailed description. It is intended that the embodiments described herein be construed as including all such modifications and alterations insofar as they come within the scope of the appended claims or the equivalents thereof.

The invention claimed is:

1. A system that facilitates providing an environmentally secured voltage testing interface comprising;
   a front panel of an electrical enclosure box into which is mounted a voltage indicator comprising a plurality of LED indicators that indicate a status of one or more circuits coupled thereto and monitored thereby; and
   a test point device that is mounted to the front panel and comprises an interface comprising a plurality of external measurement sockets configured to receive one or more probes for manual measurement of voltages;
   wherein each external measurement socket is coupled to a voltage divider that is further coupled to each of a plurality of respective wires coupled to respective LED indicators of the voltage indicator;
   wherein the plurality of external measurement sockets includes four sockets coupled via respective voltage dividers to four measured lines, L1, L2, L3, and GND.

2. The system according to claim 1, wherein the test point device further comprises a front protection cover that protects the external measurement sockets from the environment.

3. The system according to claim 2, wherein the front protection cover is attached to the front panel.

4. The system according to claim 3, wherein the front protection cover is attached to the front panel with a hinge.

5. The system according to claim 2, wherein the front protection cover is attached to the interface of the test point device.

6. The system according to claim 2, wherein the front protection cover is clear such that the measurement terminals are visible when the front protection cover is in a closed position.

7. The system according to claim 2, wherein the front protection cover comprises a latch protrusion that mates with a latch receiver positioned on the front panel to lock the front protection cover in a closed position.

8. The system according to claim 7, wherein the front protection cover comprises a latch release tab that, when actuated, causes the latch protrusion to separate from the latch receiver.

9. The system according to claim 2, wherein the front protection cover comprises an O-ring that provides a seal between the front protection cover and the front panel when the front protection cover is in a closed position.

10. The system according to claim 1, further comprising an O-ring seal positioned between the back side of the front panel and a recess on the test point device that receives the O-ring, wherein the O-ring securely seals the test point device against the back side of the front panel.

11. The system according to claim 1, further comprising a spacing sleeve that presses against an outside of a rear panel of the electrical enclosure box, and a nut that secures the test point device in the electrical enclosure upon tightening.

12. The system according to claim 1, wherein lines L1, L2, L3, and GND are further coupled to corresponding LED indicators for lines L1, L2, L3, and GND on the voltage indicator.

13. A test point device comprising:
    an interface having a plurality of external measurement sockets configured to receive one or more probes for manual measurement of voltages;
    wherein each external measurement socket is coupled to a voltage divider that is further coupled to each of a plurality of respective wires coupled to respective LED indicators of a voltage indicator; and
    a front protection cover that protects the external measurement sockets from the environment;
    wherein the external measurement sockets include four sockets that are coupled via respective voltage dividers to four measured lines, L1, L2, L3, and GND.

14. The test point device according to claim 13, wherein the front protection cover is attached to a front panel of an electrical housing by a hinge.

15. The test point device according to claim 14, wherein the front protection cover comprises a latch protrusion that mates with a latch receiver positioned on the front panel to lock the front protection cover in a closed position.

16. The test point device according to claim 15, wherein the front protection cover comprises a latch release tab that, when actuated, causes the latch protrusion to separate from the latch receiver.

17. The system according to claim 13, wherein the front protection cover comprises an O-ring that provides a seal between the front protection cover and the front panel when the front protection cover is in a closed position.

18. The test point device according to claim 13, further comprising an O-ring seal positioned between a back side of a front panel and a recess on the test point device that receives the O-ring, wherein the O-ring securely seals the test point device against the back side of the front panel.

19. A system that facilitates providing an environmentally secured voltage testing interface comprising;
    a front panel of an electrical enclosure box into which is mounted a voltage indicator comprising a plurality of LED indicators that indicate a status of one or more circuits coupled thereto and monitored thereby;
    a test point device that is mounted to the front panel and comprises an interface comprising a plurality of external measurement sockets configured to receive one or more probes for manual measurement of voltages; and
    an O-ring seal positioned between the back side of the front panel and a recess on the test point device that receives the O-ring, wherein the O-ring securely seals the test point device against the back side of the front panel;
    wherein each external measurement socket is coupled to a voltage divider that is further coupled to each of a plurality of respective wires coupled to respective LED indicators of the voltage indicator.

20. A test point device comprising:
    an interface having a plurality of external measurement sockets configured to receive one or more probes for manual measurement of voltages;
    wherein each external measurement socket is coupled to a voltage divider that is further coupled to each of a plurality of respective wires coupled to respective LED indicators of a voltage indicator;
    a front protection cover that protects the external measurement sockets from the environment; and an O-ring seal positioned between a back side of a front panel and a recess on the test point device that receives the O-ring, wherein the O-ring securely seals the test point device against the back side of the front panel.

\* \* \* \* \*